United States Patent [19]

Liu et al.

[11] Patent Number: 4,833,349
[45] Date of Patent: May 23, 1989

[54] PROGRAMMABLE LOGIC AND DRIVER CIRCUITS

[75] Inventors: Wei-Ti Liu; D. James Guzy, Jr., both of San Jose; Michael J. Salameh, Sunnyvale, all of Calif.

[73] Assignee: PLX Technology, Sunnyvale, Calif.

[21] Appl. No.: 92,054

[22] Filed: Sep. 1, 1987

[51] Int. Cl.$^4$ ...................... H03K 19/88; H03K 19/94
[52] U.S. Cl. .................................... 307/468; 307/448; 307/571
[58] Field of Search ............................ 307/465–469, 307/448, 571, 475

[56] References Cited

U.S. PATENT DOCUMENTS

| | | | |
|---|---|---|---|
| 4,124,899 | 11/1978 | Birkner et al. | 364/716 |
| 4,339,676 | 7/1982 | Ramsey | 307/473 |
| 4,472,647 | 9/1984 | Allgood et al. | 307/469 |
| 4,481,432 | 11/1984 | Davies, Jr. | 307/469 |
| 4,490,631 | 12/1984 | Kung | 307/466 |
| 4,556,806 | 12/1985 | Amin | 307/475 |

OTHER PUBLICATIONS

"Bus Interface PLD has 45-mA Output Drivers", *Electronic Products*, Apr. 1987, p. 74.
"High-Output EPLD Specializes in Building Bus Interfaces", D. James Guzy, Jr., *Electronic Design*, May 14, 1987, pp. 116–117, 120–121.

Primary Examiner—Stanley D. Miller
Assistant Examiner—Richard Roseen
Attorney, Agent, or Firm—Majestic, Parsons, Siebert & Hsue

[57] ABSTRACT

An output driver circuit is described which can be programmed by the user into tri-state or open-collector configurations, depending on the needs of the user. The driver circuit comprises a pair of a first pull-up and a pull-down FET transistor. The source of the pull-up transistor and drain of the pull-down transistor are both connected to the output of the driver. The gates of the pair of transistors are controlled by an input signal and its complement. The driver further includes a second pull-up FET whose source is connected to the output of the driver. The channel width to channel length ratio of the second pull-up transistor is at least about an order of magnitude greater than that of the first pull-up transistor. The driver further includes a control means responsive to the input signal for applying a second signal to the gate of the second pull-up transistor for programming the driver into tri-state or open-collector modes. The driver circuit may be controlled by the output of an OR gate in an AND-OR array in a FPLA or PAL device. The driver is programmable by programming the AND gate or OR gate array and applying selected input signals to the AND gate array; the driver can also be programmed permanently into the tri-state or open-collector mode.

15 Claims, 7 Drawing Sheets

NEW OUTPUT BUFFER

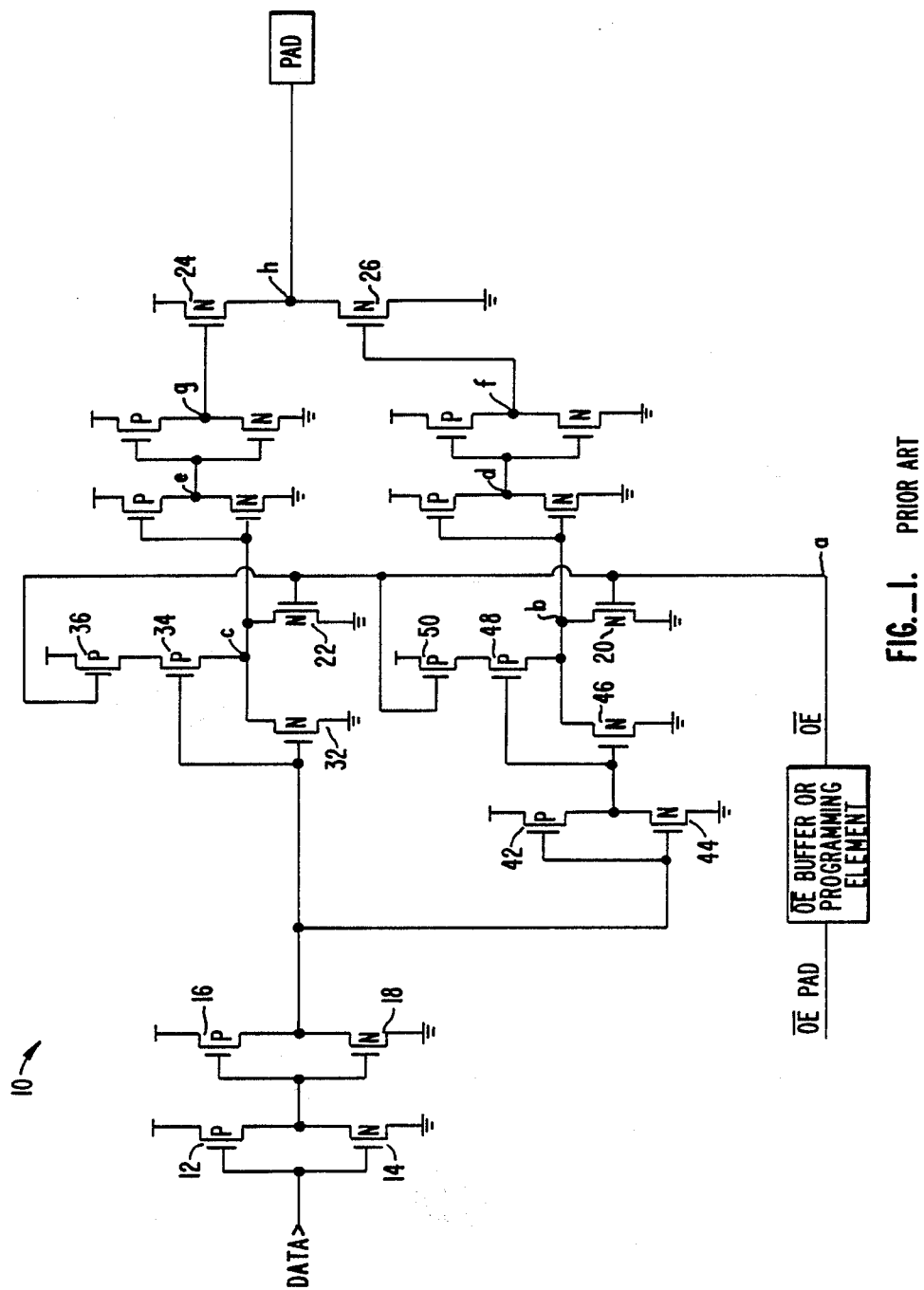
FIG._1. PRIOR ART

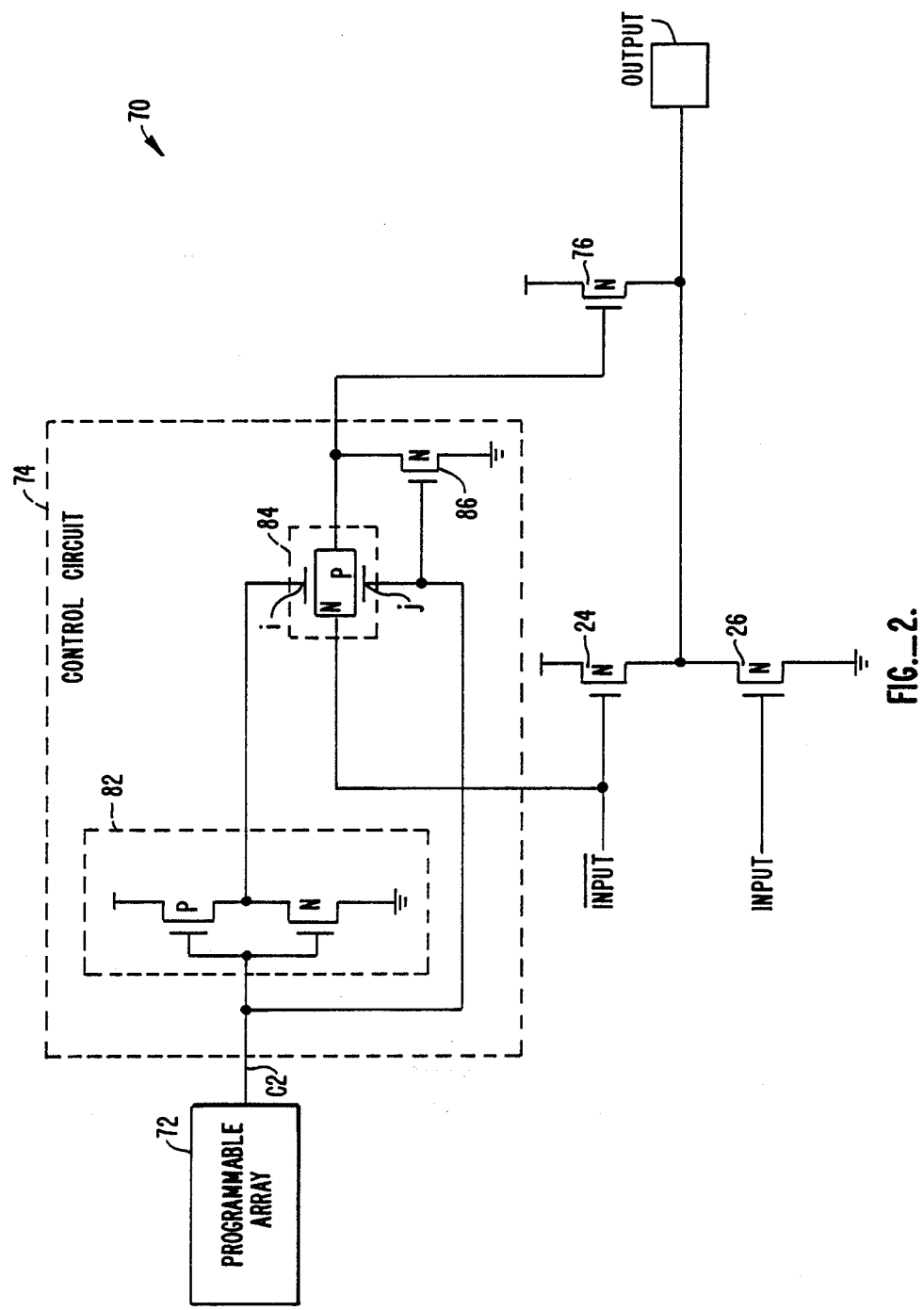
FIG._2.

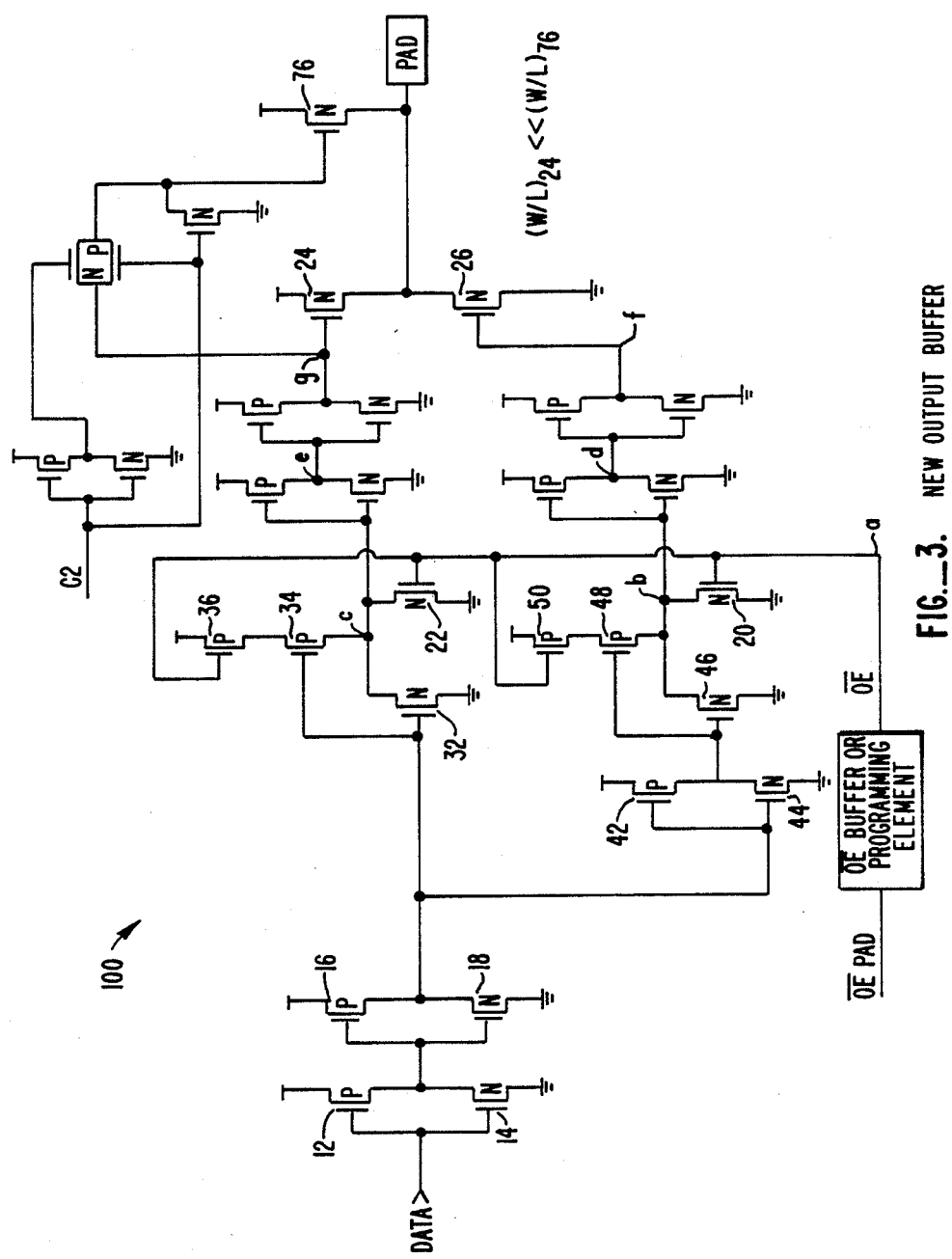
FIG._3. NEW OUTPUT BUFFER

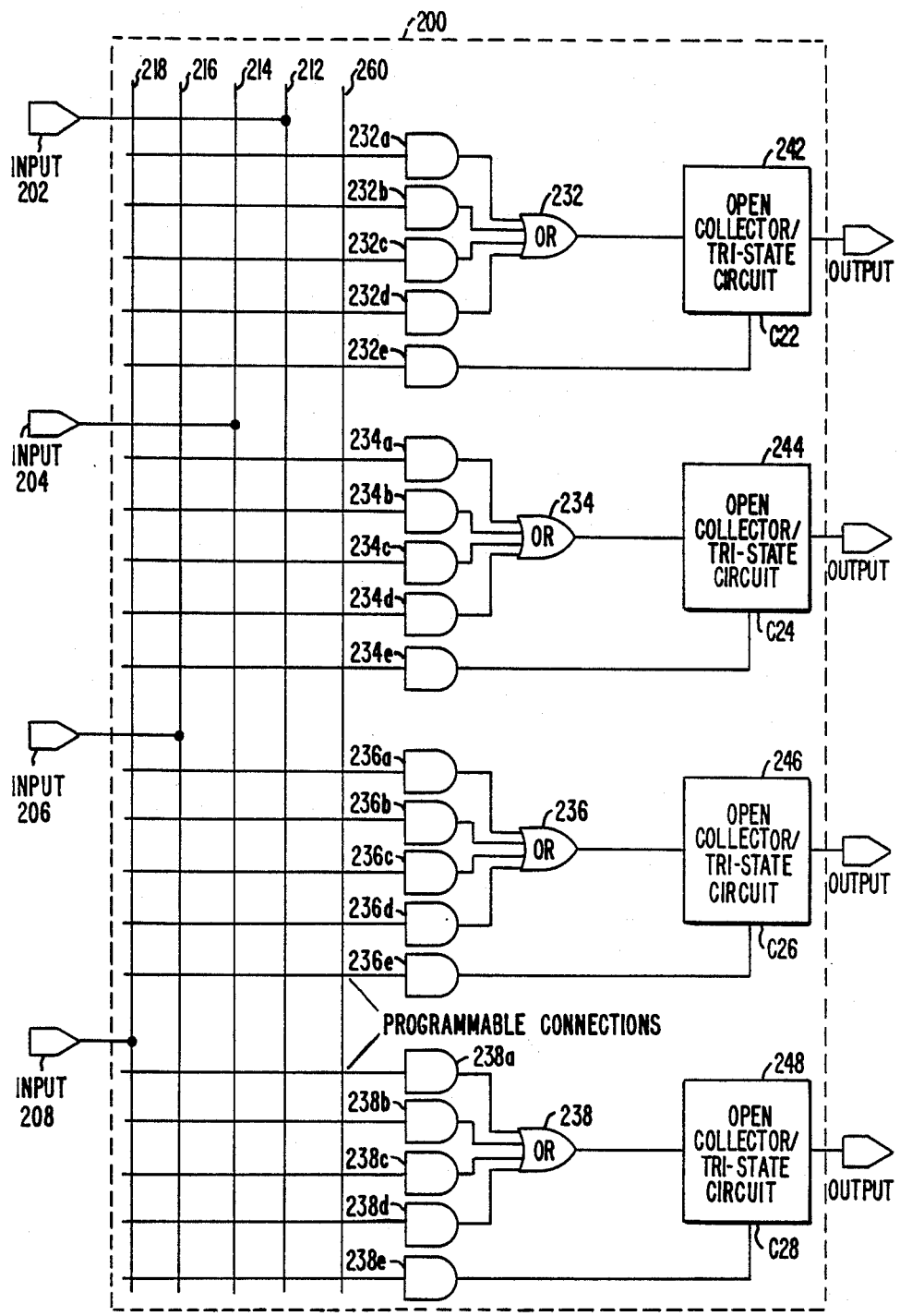
FIG._4.

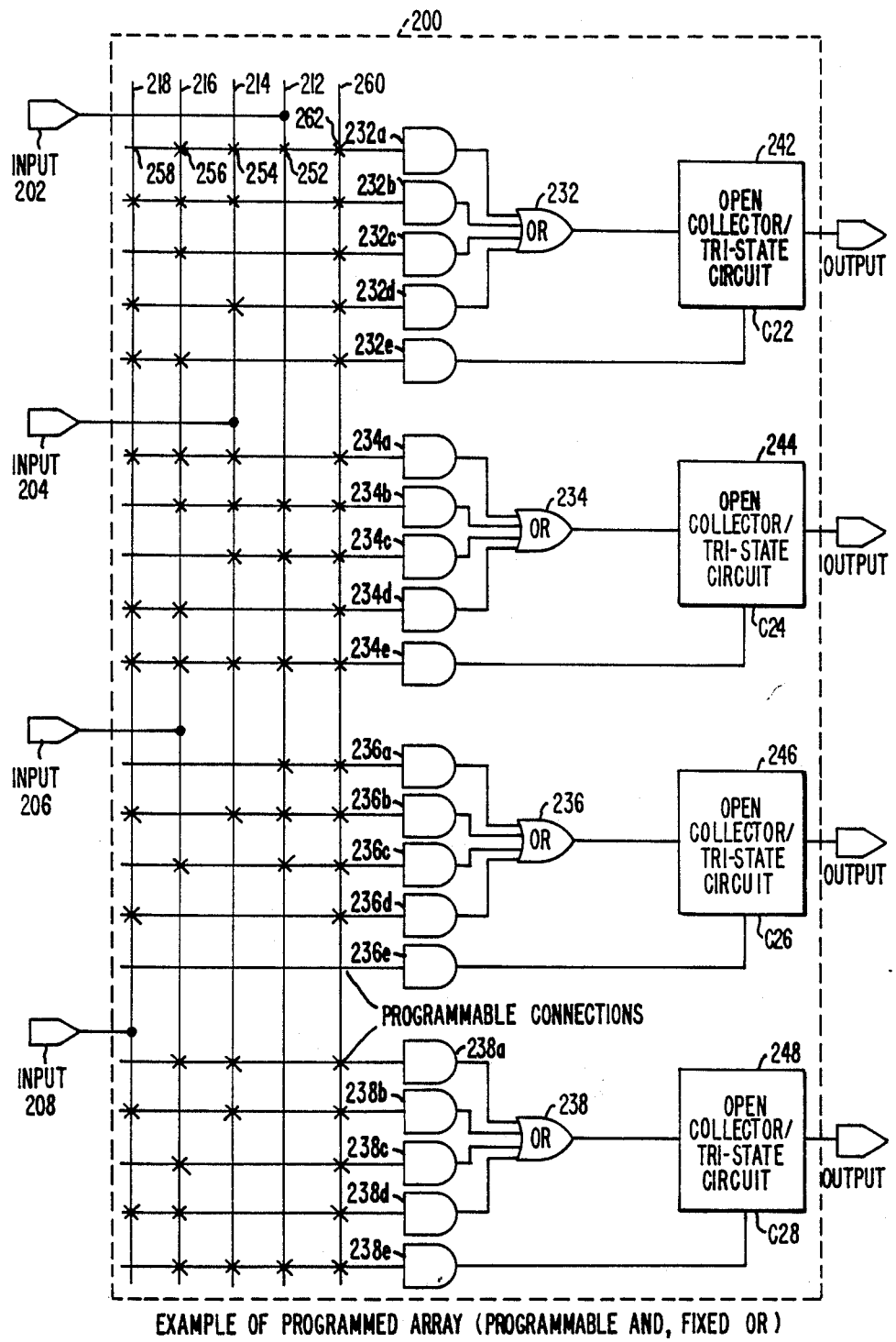
FIG._5.

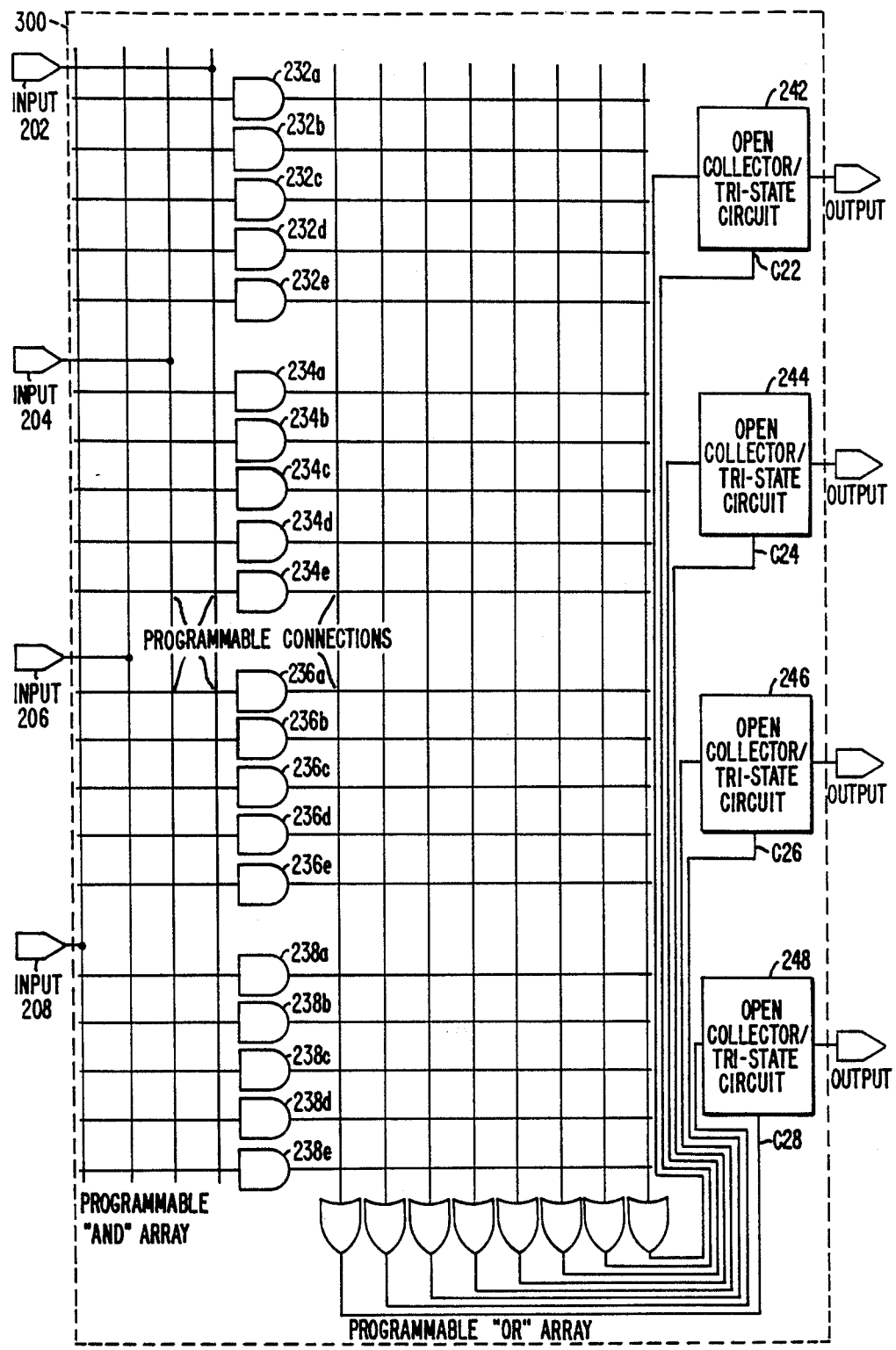
FIG._6. EXAMPLE OF UNPROGRAMMED ARRAY (PROGRAMMABLE AND, PROGRAMMABLE OR)

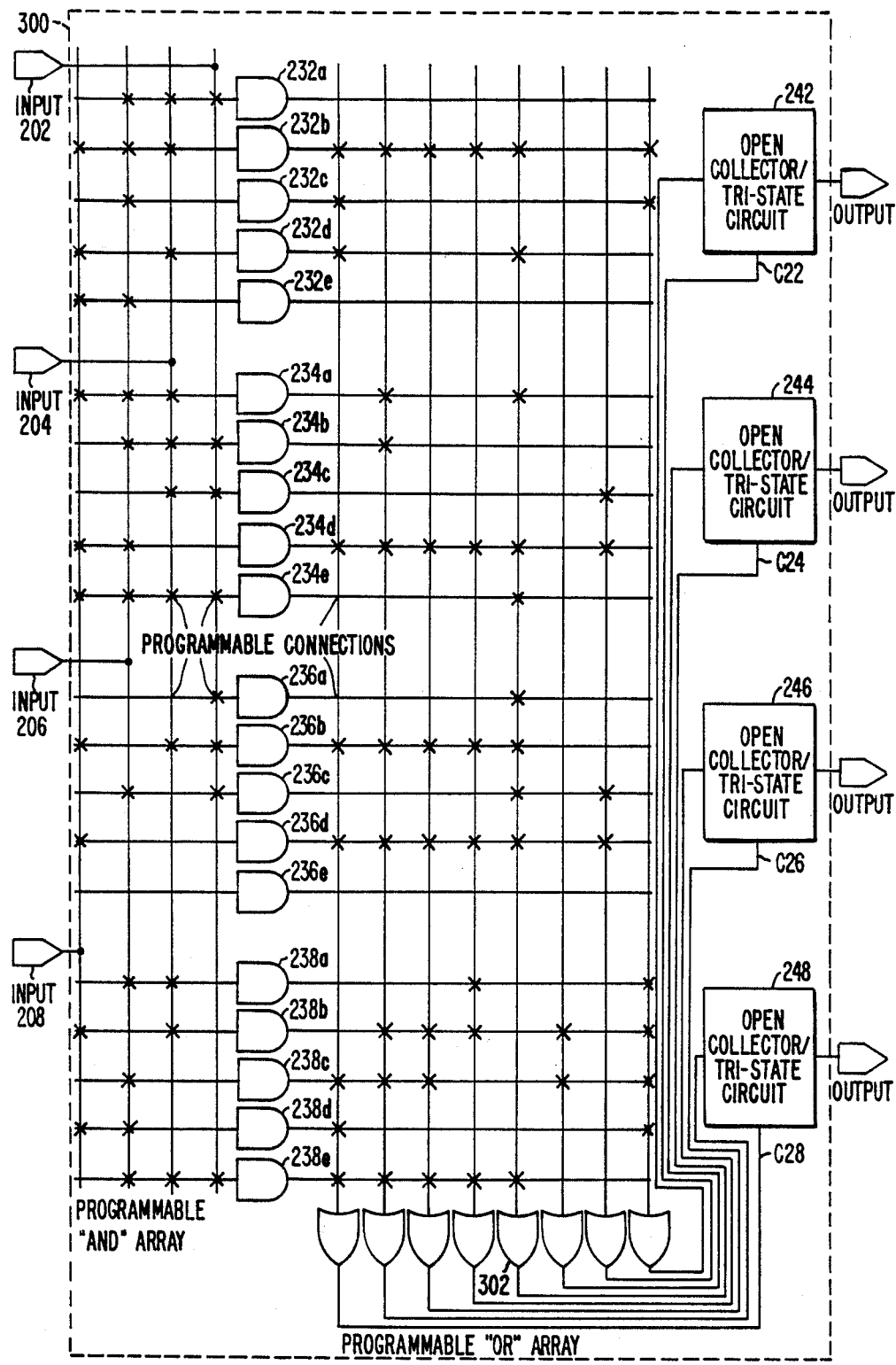
FIG._7. EXAMPLE OF PROGRAMMED ARRAY (PROGRAMMABLE AND, PROGRAMMABLE OR)

PROGRAMMABLE LOGIC AND DRIVER CIRCUITS

BACKGROUND OF THE INVENTION

This invention relates to the field of digital output driver circuits and programmable logic circuits employing output drivers, and more particularly to output drivers programmable into the "tri-state" and "open-collector" configurations and programmable logic circuits employing such programmable drivers.

Two popular configurations for digital output circuits are "tri-state" and "open collector". These configurations drive a "bus", which is an electrical signal pathway which connects one or more outputs to one or more inputs. In the context of this patent application, "bus" is a broad term which means any trace or wire which connects integrated circuits or other electrical devices.

Tri-state (or "three-state") configurations are commonly used in circuits where only one output may be driving a particular bus at any one time. They are called tri-state because the output can achieve three possible states: high impedance, logical level low and logical level high.

The tri-state configuration is controlled by an input called Output Enable (OE). The polarity of OE determines whether the tri-state driver is enabled or disabled (on or off). When OE is of one polarity, the driver is in the high impedance state, in which case the driver is disabled. When OE is of the other polarity, the driver is in the logical low or high state, in which case the driver is enabled.

If the tri-state driver is disabled (off), the state of the driver is "high impedance", and the tri-state driver has no influence on the logical level of the bus it is connected to. It will allow the bus to achieve the logical level (high or low) which is determined by other outputs or circuit elements connected to the bus.

If the tri-state driver is enabled (on), then it acts as a totem-pole driver. A totem-pole driver is one which always tries to drive the level of the bus to the logical level indicated by the circuitry which controls it. For example, if the logic controlling the output indicates a logical level high, then the totem-pole output drives the bus to the logical high voltage level. If the logic indicates a logical level low, then the totem-pole output drives the bus level down to the logical low voltage level. Alternatively, the totem-pole driver may drive the bus to the opposite logical state from that of the logic controlling the driver, if the driver is an inverting driver.

It is important that only one totem-pole output attempts to drive a bus at the same time. If two totem-pole outputs try to drive the same bus simultaneously, and if futhermore they are trying to drive in opposite directions (one logical high and the other logical low), an unpredictable or ambiguous logical level will result on the bus. This will cause the entire circuit to function incorrectly.

To avoid this problem, designers must design circuits which contain tri-state outputs such that only one tri-state driver on the same bus can be enabled at the same time. For example, if there are four tri-state drivers on a bus, the designer must make sure that only one of those four be enabled (act as a totem-pole driver) at any one time. The other three must be disabled (in high impedance state).

In circuits where more than one output may drive the bus at the same time, the open-collector output configuration is commonly used. As with the totem-pole driver, if the logic which controls the open collector output indicates a logical level low (or logical level high in the case of an inverting driver), the open collector output will drive the bus to a low voltage level. However, if the logic which controls the open-collector output indicates a logical level high (or logical level low in the case of an inverting driver), the output will become high impedance, which means it will not influence the logical level of the bus. In the high impedance state the open-collector driver will allow the bus electrical signal level to attain any level (logical high or logical low) which is determined by other outputs or devices driving the bus.

The result of this nature of the open-collector output is that the logical level of that bus will be low if one or more of the open-collector outputs is driving the bus low. The logical level of the bus will be high if and only if all the logic which drives the open-collector outputs indicate a logical high level (or logical level low if the driver is inverting). Another way of stating this relationship is that the logical level of the bus is the logical NOR of all the open-collector outputs connected to the bus.

In situations where one or more outputs may be driving a bus simultaneously, using open-collector outputs eliminates the possibility of unpredictable or ambiguous bus logic levels. In many applications the designer requires that the bus be an "active low wired OR bus". In these cases open collector drivers are used.

There are many integrated circuits (ICs) available whose output circuits are tri-state configuration and many whose outputs are open-collector configuration. There are also many ICs available in which some of the outputs are open-collector and others are tri-state. These conventional output circuits are fixed in their configurations at either tri-state or open-collector; their configurations cannot be changed through programming with bipolar or MOS fuses.

In programmable logic circuits, output drivers have conventionally been used to drive the outputs of the programmable arrays. One type of conventional programmable logic circuit employs an array of AND gates and a second array of OR gates. Input signals to the circuits are carried by a number of input lines. The circuit is programmable by selectively connecting the input lines to the circuit and the input lines to the AND gates. If the connections between outputs of the AND gates and inputs of the OR gates are also programmable, the logic circuit is referred to conventionally as Field Programmable Logic Arrays (FPLAs). Some examples of FPLAs are Signetics parts PLS-100. Where the outputs of the AND gates are non-programmably connected to the inputs of the OR gates, the logic circuits are referred to as Programmable Array Logic (PAL). For an example of a PAL device, see U.S. Pat. No. 4,124,899 to Birkner et al.

The outputs of the OR gates in the FPLA or PAL circuits are then supplied to output driver circuits which, in turn, drive a bus. In some applications, it is desirable to use output drivers which are in the tri-state configuration; in other applications, it is desirable to use open-collector output drivers. In conventional programmable logic circuits, however, the configuration of the output drive is fixed and cannot be selected by the user. Most, if not all, of the programmable logic circuits available now offer only tri-state or totem-pole drivers. None offer open-collector drivers. It is therefore desirable to provide programmable logic circuits in which the configuration of the output drivers is also programmable to enable the user to select the desirable configuration for a particular application.

SUMMARY OF THE INVENTION

An output circuit is described which can be programmed by the user to an open-collector configuration or a tri-state configuration, depending on the precise needs of that user. The programming is performed in the preferred embodiment by means of MOS or bipolar fuses. This feature adds substantially to the flexibility of the IC of which these output circuits are a part. It is particularly useful as part of a programmable logic device which requires both tri-state and open-collector output configurations in varying combinations.

For example, suppose the IC has four of these programmable output circuits. For one application, the user can configure the IC to have one open-collector output, or three tri-state outputs. In another application, he can configure the IC to have two open-collector and two tri-state outputs, or zero tri-state and four open-collector, or any combination required for the application.

The programmability feature enhances the user's ability to customize an IC to a particular application, which allows him to use less ICs to perform a particular function which tends to improve the performance and reduce the cost and size of the user's end product.

The driver circuit of this invention is programmable into tri-state and open-collector modes. The driver circuit comprises a pair of a first pull up field effect transistor and a pull down field effect transistor, wherein the source of the pull up transistor and drain of the pull down transistor are both connected to the output of the driver circuit. The gates of the pair of transistors are controlled by an input signal and its complement. The driver circuit further comprises a second pull up field effect transistor whose source is connected to the output of the driver circuit. The channel width to channel length ratio of the second pull up transistor is at least about an order of magnitude greater than that of the first pull up transistor. The driver circuit further comprises a control means responsive to the input signal for applying a second signal to the gate of the second pull up transistor, such that when the tri-state mode is desired, the second signal is in a state which is either the same as or opposite to the state of the input signal, and when the open-collector mode is desired, the second signal causes the second pull up transistor to be pinched off.

Another aspect of the invention is directed towards a programmable integrated logic circuit comprising a plurality of AND gates, a plurality of OR gates, a plurality of input lines and means for connecting the outputs of the AND gates and the inputs of the OR gates. The logic circuit further comprises a plurality of AND gate input lines for each of the AND gates, means for selectively connecting input lines and AND gate input lines to program a desired logical output from said OR gates. The logic circuit also comprises a plurality of output drivers wherein each driver is controlled by the output of a corresponding OR gate and wherein one or more driver is programmable into tri-state mode or open-collector mode and means for programming the one or more of the programmable drivers into tri-state or open-collector mode as desired.

The programmable integrated logic circuit described above has the following advantages. The output drivers are individually programmable from the array so that the user can select a configuration of each output driver without using external pins dedicated to controlling drivers. Avoiding the use of external pins reduces the package size and cost of the programmable logic device.

BRIEF DESCRIPTION OF THE DRAWINGS

FIG. 1 is a schematic diagram illustrating a conventional output driver.

FIG. 2A is a schematic circuit diagram of a portion of an output driver illustrating the preferred embodiment of the invention.

FIG. 2B is the schematic circuit diagram of an output driver illustrating the preferred embodiment of the invention.

FIGS. 3 and 4 are schematic circuit diagrams of a logic circuit illustrating another aspect of the invention where FIG. 3 shows the state of the circuit in an unprogrammed state and FIG. 4 shows the circuit in a programmed state.

FIGS. 5 and 6 are schematic circuit diagrams of another logic circuit illustrating another aspect of the invention where FIG. 5 illustrates the state of the circuit in an unprogrammed state and FIG. 6 illustrates the state of the circuit in a programmed state.

DETAILED DESCRIPTION OF THE INVENTION

FIG. 1 is a schematic circuit diagram of a conventional output driver circuit which can be operated in tri-state mode. The output driver 10 is controlled by an output enable signal. In FIG. 1, this is shown as the OE complement signal applied at node a. When the output enable signal is in one state, the output of the output driver at h is in high impedance mode. When the output enable signal is in the other state, the output signal at h either simply follows the states of the input data either in exactly the same or opposite states. The conventional output driver circuit 10 is not suitable for the open-collector configuration.

As shown in FIG. 1, output driver 10 comprises a buffer which includes two pairs of pull up and pull down FETs 12, 14, 16, 18. When the output enable complement signal at node a is high, FETs 20 and 22 are turned on so that nodes b, c are at "0" states. Therefore, nodes g, f are also at state "0" since these nodes are connected to nodes c, b through two buffers comprising two pairs of pull up and pull down FETs. Therefore, both transistors 24 and 26 are turned off so that node h is in the high impedance state. Therefore, irrespective of the input data, when the output enable signal causes node a to be in the "1" state, the output h is in the high impedance mode.

When the output enable signal causes node a to be in the "0" state, FETs 20, 22 will be pinched off. When the input data is in the state "0", FET 32 is turned off and FET 34 is turned on. Since FET 36 is turned on by the "0" state at node a, this causes node c to be in the "1" state. The input "0" state is inverted by FETs 42 and 44, thereby turning on FET 46 and pulling node b to "0" state. Nodes g, f follow nodes c, b to states "1" and "0", respectively. This turns on FET 24 and turns off FET 26, causing node h to be in the "1" state.

If the input data is at state "1", this turns on FET 32 and pulls node c to "0" state. The input signal is again inverted by FETs 42, 44, thereby turning off FET 46 and turning on FET 48. Since FET 20 is turned off and FET 50 is turned on by the "0" state at node a, node b is in the "1" state. Nodes g, f follow nodes c, b to "0" and "1" states, respectively. This turns off FET 24 and turns on FET 26, causing node h to be in the "0" state.

From the above description, it is apparent that, when the output enable signal causes node a to be in the "0" state, the output of output driver 10 follows the input data but in the opposite state. Hence, when the output enable complement signal causes node a to be in the state "0", driver 10 is in the totem-pole mode. The above described operation of driver 10 in the high-impedance and totem-pole modes are summarized below in Table 1.

TABLE I

| DATA | OE | a | b | c | d | e | f | g | h | (OUTPUT) |
|------|----|----|----|----|----|----|----|----|----|----------|
| 0 or 1 | 1 | 1 | 0 | 0 | y | 1 | 0 | 0 | | high impedance |
| 0 | 0 | 0 | 0 | 1 | 1 | 0 | 0 | 1 | 1 | 1 |
| 1 | 0 | 0 | 1 | 0 | 0 | 1 | 1 | 0 | 0 | 0 |

FIG. 2A is a schematic circuit diagram of a portion of an output driver circuit 70 controlled by a programmable array 72 to illustrate the preferred embodiment of the invention. A control signal C2 from the programmable array 72 controls the configuration of the output driver. In the circuit of FIG. 2A, the output driver is in the tri-state mode when the control signal C2 is in the "0" state; and when the signal C2 is in the "b 1" state, the output driver is in the open-collector mode. It will be understood, however, that a slight alteration of the driver circuit permits the low and high states of C2 to correspond to the open-collector and tri-state modes respectively instead. All such configurations are within the scope of the invention. For example, some implementations may not require FET 24 in FIG. 2A. This would reverse the polarity of C2.

As shown in FIG. 2A, the control signal C2 is generated in a programmable array 72 and fed to a control circuit 74. Control circuit 74 generates a control signal in response to the signal C2 and the complement of the input signal, where the control signal is used to control the gate of an N-channel FET 76. The output of the output driver 70 in the preferred embodiment is connected to the sources of FETs 24, 76 and the drain of FET 26 as shown in FIG. 2A. The gates of FETs 24, 26 are controlled by the complement of the input signal and the input signal respectively. Control circuit 74 is such that when signal C2 is in the "0" state, the control signal generated by circuit 74 simply follows the complement of the input signal, and that when signal C2 is in the "1" state, the control signal is in the "0" state, thereby pinching off FET 76. In other words, when signal C2 is in the "0" state, the output driver is configured in the totem-pole mode.

When the signal C2 is in the "1" state, FET 76 is pinched off. FETs 24, 76 are both pull up transistors where the ratio of the channel width to channel length of FET 76 is at least an order of magnitude greater than that of FET 24. This means that when FET 76 is pinched off, there is only a small leakage current through FET 24 even when FET 24 is turned on so that essentially the output driver in the preferred embodiment is in the open-collector mode when signal C2 is in the "1" state.

In the preferred embodiment, the control circuit 74 comprises an inverter 82, a transfer gate 84 and an N-channel FET 86. Signal C2 is inverted by inverter 82 and applied to transfer gate 84 at node i. When the signal applied to transfer gate 84 at node i is in the "1" state, the transfer gate 84 simply passes the complement of the input signal to the gate of FET 76. But when the signal applied to transfer gate at node i is in the "0" state, the transfer gate does not pass the complement of the input signal to FET 76.

In the preferred embodiment, the transfer gate 84 is a CMOS device including both an N-channel and a P-channel where the signal C2 and its complement are applied to nodes j, i respectively. The signal C2 is also applied to the gate of FET 86. Therefore, when signal C2 is in the "1" state, nodes i, j are at "0", "1" states respectively. This causes transfer gate 84 to be pinched off, turns on FET 86, thereby pulling low the gate of FET 76, causing the output driver 70 to be in the open-collector mode as described above. When signal C2 is in the "0" state, nodes i, j are in the "1", "0" states respectively, FET 86 is pinched off and transfer gate 84 passes the complement of the input signal to the gate of FET 76 as described above.

FIG. 2B is a schematic circuit diagram of an output driver illustrating the preferred embodiment of the invention. The identical components of FIGS. 1, 2A, 2B are identified by the same numerals. As described in reference to FIG. 2A, when the signal C2 is high, FET 76 is pinched off so that output driver 100 will be in the open-collector mode. However, when the signal C2 is low, the gate of FET 76 simply follows the state of node g. As described above in reference to FIG. 1, when the output enable signal causes node a to be in the "1" state, both nodes f and g are in the "0" state. Therefore, when signal C2 is in the "0" state and node a is in the "1" state, all three FETs 24, 26 and 76 are pinched off so that the output of driver 100 will be in the high impedance state.

When both signal C2 and node a are in the "0" state, node f will follow the input data and node g will follow the input data in the exactly opposite state. As described above, in reference to FIG. 1, so that the output of driver 100 will also follow the input data in the exactly opposite state.

It will be noted that, when the output enable signal causes node a to be in the "1" state, this causes both FETs 24, 26 to be also pinched off, thereby rendering driver 100 to be in the high impedance state irrespective of the state of the signal C2.

From the above it will be evident that a programmable output driver is provided. The state of control signal C2 controls the mode of driver 100. When the control signal C2 is in one state, driver 100 is in the open-collector mode. When the control signal C2 is in the other state, driver 100 is in the totem-pole mode. This permits the user to program the configuration of the driver depending on the application required and provides design flexibility.

PAL circuits employing programmable AND gate arrays non-programmably connected to OR gate arrays normally include output drivers to enable the outputs of the OR gate arrays to drive a bus. In conventional PAL circuits, such output drivers are not programmable so that once a particular type (i.e. open-collector or totem-pole) of output driver is employed to drive a particular OR gate output, such configuration cannot be changed. This limits the design flexibility of the circuits. It is therefore advantageous to provide PAL circuits where the user can alter the mode of the output driver by programming the PAL circuits. Such capability is provided by the circuit 200 of FIGS. 3 and 4 as described below.

FIG. 3 is a schematic circuit diagram of an unprogrammed PAL circuit to illustrate another aspect of the invention. As shown in FIG. 3, PAL circuit 200 includes 4 inputs 202-208, connected respectively to 4 input lines 212-218. PAL circuit 200 includes 4 OR gates 232-238. Each OR gate has 4 inputs which are nonprogrammably connected to the outputs of an array of 4 AND gates as shown in FIG. 3. Thus, the 4 inputs of OR gate 232 are nonprogrammably connected to the outputs of AND gates 232a-232d. The 4 outputs of the OR gates 232-238 drive output drivers 242-248, respectively. The outputs of each driver are then used to drive a bus. Also included in this example is a driver configuration control line (260). FIGS. 3, 4, 5 and 6 are simplified diagrams which exclude many features present in many programmable logic circuits, such as Output Enable (OE) and feedback. These examples contain only enough features to demonstrate the invention of this patent.

When circuit 200 is unprogrammed, the four input lines 212-218 are each connected to the inputs of each of the 20 AND gates shown in FIG. 3. The convention used in FIGS. 3-6 for showing the connecting and nonconnecting input lines and inputs of the AND gates and/or OR gates is frequently used in data sheets, such as the Signetics data sheets for PLS 151, dated Aug. 19, 1985.

The connections between the four input lines, line 260 and the inputs of the AND gates are programmed by blowing fuses. Thus, if only input line 218 should be connected to the input of AND gate 232a, the fuses for the connections between input lines 212-216 and line 260 to AND gate 232a are blown so that only input line 218 remains connected to the input of the AND gate. When the fuse between an input line and the input of an AND gate is blown, this is shown schematically by marking an "X" at the connection. Thus, the result of blowing the fuses for the connections between input lines 212-216 and line 260 and the inputs of AND gate 232a is indicated by the four "X" symbols labelled 252, 254, 256 and 262 in FIG. 4. As also shown in FIG. 4, the inputs of AND gate 232b are connected to input line 212 only, since the fuses for the connections between input lines 214-218 and the inputs of AND gate 232b are blown.

One or more of the output drivers 242-248 are programmable by means of the control signals C22-C28. One implementation of such programmable output driver is circuit 100 of FIG. 2B which employs FETs. However, it will be understood that bipolar transistors can also be used to implement the programmable output driver circuits. The use of bipolar circuits to implement the one or more programmable driver circuits of FIGS. 3 and 4 and of the drivers in FIGS. 5 and 6 described below is within the scope of this invention.

While the control signal C2 may originate directly from a source external to circuit 200, such manner of control requires an extra pin if circuit 200 is implemented in integrated circuit chip form. Hence, if it is desired to supply 4 independent control signals C22-C28 for controlling 4 output drivers, 4 extra external pins are required. While it is possible to reduce the number of extra pins required by supplying the same control signal to more than one output driver, this reduces flexibility and in any event at least one extra pin is required. The use of additional external pins require enlarging the package size of the chip which adds costs and takes up more space. This is undesirable.

This invention is based on the observation that, instead of using external pins, the configuration of the programmable output drivers may be controlled by the outputs of one or more AND gates in the AND gate array as shown in FIGS. 3 and 4. For example, the configuration of driver 242 is controlled by the output of AND gate 232e. The output of AND gate 232e is determined by the programming of the PAL circuit 200 and the states of the inputs which will effect the output of the AND gate. Thus as shown in FIG. 4, the inputs of AND gates 232e are connected to input lines 212 and 214. Thus the output of these AND gates will depend on the states of input lines 212 and 214. Therefore, the user can control the configuration of driver 242 by blowing the appropriate fuses in the connections between the inputs of AND gate 232e and the four input lines and line 260 and by applying the appropriate input signals to the input lines to which the AND gate is connected after programming.

As shown in FIG. 4, the input of AND gate 238a is connected to only one input line, namely line 218. Therefore the configuration of driver 248 is controlled directly by the state of the signal applied to input 208. If a signal "1" is applied to input 208, driver 248 will be in the open-collector mode; whereas if a signal "0" is applied to input 208, driver 248 will be in the totem pole mode. Thus, it is possible to control the configuration of a particular driver directly by an external signal in the manner described above.

The two examples above show how a user may dynamically control the state of the output driver, i.e. through signals applied to the input pins. The user may also permanently configure the state of a particular driver such that it remains in the open collector or totem-pole configuration after programming regardless of the state of the inputs. As an example in FIG. 4, fuses at the intersections of input lines 212, 214, 216, 218, control line 260 and AND gate 234e are all blown. This will cause C24, the control signal of output driver 244 to be in the high state (open collector) permanently because when all the fuses at the input of an AND gate are blown, the output is high.

Conversely, if the fuse at the intersection of control line 260 and the AND gate input to the output driver is not blown (as is the case with AND gate 236e) then the control signal (C26 in this example) will be permanently low since line 260 is always low in this embodiment, causing the driver to be in a totem-pole configuration permanently.

FIGS. 5 and 6 are schematic circuit diagrams of a FPLA circuit 300 shown respectively in the unprogrammed and programmed states to illustrate yet another aspect of the invention. The identical components in the circuits of FIGS. 3-6 are labelled by the same numerals. In the PAL circuit 200 of FIGS. 3 and 4, the connections between inputs of the OR gates and the outputs of the AND gates are non-programmably connected. In the FPLA circuit 300 of FIGS. 5 and 6, however, the connections between the output lines of the AND gates and the inputs of the OR gates are also programmable, again by blowing or not blowing fuses. The one or more programmable output drivers are controlled by the outputs of one or more OR gates as shown in FIGS. 5 and 6. Thus, the configuration of a particular programmable driver is controlled by selectively blowing the fuses for the OR gate generating the control signal and by applying the appropriate input signals. Thus, driver 244 is controlled by the output of OR gate 302. As shown in FIG. 6, the input of OR gate 302 are connected to the outputs of AND gates 232a, 232c, 232e, 234b, 234c, and 238a–238d. The inputs of these AND gates are then selectively connected to the input lines 212-218 in the manner described above. Thus, by selecting the appropriate connections and then applying the appropriate input signals, the configuration of driver 244 can be controlled. The driver circuits may also be configured permanently by use of a control line in the OR plane similar to line 260 in FIGS. 3 and 4, but is not shown here.

The programming of circuits 200 and 300 can be performed in a conventional manner. For example, they may be programmed by applying high voltage on one or more pins (not shown) dedicated for programming the device. The high voltage applied to the dedicated pins causes the four input pins and four output pins in FIGS. 3-6 to stop acting as inputs and outputs and act instead as decoders of an eight bit signal which indicates which fuse to program. For example, if the eight bit signal 00000101 appears on the eight input and output pins, this points to fuse location 5 which may be fuse 262 in FIG. 4. If a "0" is presented to another pin (not shown), fuse 5 is to be left intact. If a "1" is presented to such pin, fuse 5 is to be blown. In such manner each fuse location would be accessed and either blown or not blown depending on the logic circuit desired. When programming is complete, the high voltage is removed and the device becomes a logic device again, configured in a manner determined by the programming step. The programmed device may, for example, be in a configuration of FIGS. 4 or 6. While the circuits 200, 300 are described as programmed by fuses, it will be evident that such circuits may also be programmed by other means as well, such as EPROM and EEPROM. All such configurations are within the scope of the invention.

From the above, it will be seen that logic circuits employing programmable output drivers with great flexibility are provided. No extra external pins are required for programming the output drivers. The user can program the configuration of the drivers by programming and applying the appropriate input signals or may permanently configure each output individually. This provides great flexibility for the user in using the chip for many different applications. While the above description of circuit implementation and method is merely illustrative thereof, various changes and arrangements or other details of the method or implementation may be within the scope of the appended claims.

I claim:

1. A driver circuit for use in logic circuits, said driver circuit being programmable into tri-state and open-collector modes, wherein said circuit has an output, said driver circuit comprising:
   a pull down field effect transistor having a drain and a gate, wherein the drain of the pull down transistor is connected to the output of the driver circuit, and wherein the gate of the transistor is controlled by an input signal;
   a first pull up field effect transistor having a source and a gate, wherein the source of the pull up transistor is connected to the output of the driver circuit; and
   control means responsive to the input signal for applying a second signal to the gate of the pull up transistor, such that when the tri-state mode is desired, the second signal follows the level of the input signal or its complement, and when the open-collector mode is desired, the second signal causes the pull up transistor to be pinched off.

2. The circuit of claim 1, wherein the control means comprises:
   means for generating a control signal indicative of whether tri-state or open-collector mode is desired;
   a transfer gate for transferring the input signal to the gate of the pull up transistor when the control signal indicates that tri-state is desired; and
   a second pull down field effect transistor for pulling down the voltage at the gate of the pull up transistor when the control signal indicates that open-collector mode is desired.

3. The circuit of claim 2, wherein the transfer gate is a CMOS device having a P-channel and a N-channel and a gate for each channel, said circuit further comprising:
   an inverter for inverting the control signal, wherein the control signal and the inverted control signal are each applied to one of the two gates controlling the two channels.

4. A programmable integrated logic circuit comprising:
   a plurality of AND gates each having an output;
   a plurality of OR gates each having an input;
   means for connecting the outputs of the AND gates and the inputs of the OR gates;
   a plurality of input lines;
   a plurality of AND gate input lines for each of the AND gates;
   means for selectively connecting input lines and AND gate input lines to program a desired logical output from said OR gates;
   a plurality of output drivers wherein each driver is for driving the output of a corresponding OR-gate and wherein one or more drivers are programmable into tri-state mode or open-collector mode; and
   means for programming the one or more programmable drivers into tri-state or open-collector mode as desired.

5. The circuit of claim 4, wherein said means for connecting the outputs of the AND-gates and the inputs of the OR gates is programmable to permit a user to selectively connect the outputs of the AND gates to inputs of the desired OR gates.

6. The circuit of claim 4, wherein said means for connecting the outputs of the AND-gates and the inputs of the OR gates is non-programmable.

7. The circuit of claim 4, wherein the means for programming the one or more programmable drivers comprises means for connecting such drivers to the outputs of AND gates or OR gates, so that each programmable driver is programmable by programming the AND gate or OR gate array and applying selected input signals to the AND gate array.

8. The circuit of claim 4, wherein the programming means is such that the one or more programmable drivers are programmable by the programming means permanently into tri-state or open-collector mode.

9. The circuit of claim 4, wherein at least one of said programmable driver circuits has an output and comprises:

a pull down field effect transistor having a drain and a gate, wherein the drain of the pull down transistor is connected to the output of the driver circuit, and wherein the gate of the transistor is controlled by the output signal of the corresponding OR gate;

a first pull up field effect transistor having a gate and a source, wherein the source of the pull up transistor is connected to the output of the driver circuit; and control means responsive to the output signal of the corresponding OR gate for applying a second signal to the gate of the pull up transistor, such that when the tri-state mode is desired, the second signal follows the output signal of the corresponding OR gate or its complement, and when the open-collector mode is desired, the second signal causes the pull up transistor to be pinched off.

10. The circuit of claim 9, wherein the control means comprises:

means for generating a control signal indicative of whether tri-state or open-collector mode is desired;

a transfer gate for transferring the output signal of the corresponding OR gate to the gate of the pull up transistor when the control signal indicates that tri-state is desired; and a second pull down field effect transistor for pulling down the voltage at the gate of the pull up transistor when the control signal indicates that open-collector mode is desired.

11. The circuit of claim 10, wherein the transfer gate is a CMOS device having a P-channel and a N-channel and a gate for each channel, said circuit further comprising:

an inverter for inverting the control signal, wherein the control signal and the inverted control signal are each applied to one of the two gates controlling the two channels.

12. The circuit of claim 1, further comprising a second pull up field effect transistor having a gate and a source, the source of the second pull up field effect transistor being connected to the output of the circuit and the gate of the second pull up field effect transistor being controlled by the complement of the input signal, wherein the channel width to channel length ratio of the first pull up transistor is at least an order of magnitude greater than that of the second pull up transistor.

13. The circuit of claim 9, further comprising a second pull up field effect transistor having a gate and a source, the source of the second pull up field effect transistor being connected to the output of the driver circuit and the gate of the second pull up field effect transistor being controlled by the complement of the output signal of the corresponding OR gate, wherein the channel width to channel length ratio of the first pull up transistor is at least an order of magnitude greater than that of the second pull up transistor.

14. The circuit of claim 1, further comprising means for causing the circuit output to be at high impedance.

15. The circuit of claim 9, wherein said a least one programmable driver further comprises means for causing the driver circuit output to be at high impedance.

* * * * *